(12) United States Patent
Zhang et al.

(10) Patent No.: US 10,720,778 B2
(45) Date of Patent: Jul. 21, 2020

(54) METHOD FOR IDENTIFYING TYPE OF CABLE, POWER ADAPTER AND CABLE

(71) Applicant: Guangdong Oppo Mobile Telecommunications Corp., Ltd., Dongguan, Guangdong (CN)

(72) Inventors: Jialiang Zhang, Guangdong (CN); Chen Tian, Guangdong (CN); Jun Zhang, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 596 days.

(21) Appl. No.: 15/450,711

(22) Filed: Mar. 6, 2017

(65) Prior Publication Data

US 2017/0179744 A1  Jun. 22, 2017

Related U.S. Application Data

(63) Continuation of application No. PCT/CN2015/077804, filed on Apr. 29, 2015.

(51) Int. Cl.
*H02J 7/00* (2006.01)
*G01R 19/165* (2006.01)
*H01R 13/713* (2006.01)

(52) U.S. Cl.
CPC .......... *H02J 7/00* (2013.01); *G01R 19/16595* (2013.01); *H01R 13/713* (2013.01); *H02J 7/0045* (2013.01)

(58) Field of Classification Search
None
See application file for complete search history.

(56) References Cited

U.S. PATENT DOCUMENTS

| 8,970,165 | B2 | 3/2015 | Wada et al. |
| 2006/0195286 | A1 | 8/2006 | Tsai |
| 2007/0278999 | A1 | 12/2007 | Hsia |
| 2009/0027010 | A1 | 1/2009 | Ha et al. |
| 2009/0248924 | A1* | 10/2009 | Melin ............... G09G 5/006 |
| | | | 710/63 |

(Continued)

FOREIGN PATENT DOCUMENTS

| CN | 1967965 A | 5/2007 |
| CN | 101227032 A | 7/2008 |

(Continued)

OTHER PUBLICATIONS

Extended European Search Report issued in corresponding European application No. 15890259.3 dated Jan. 5, 2018.

(Continued)

*Primary Examiner* — Jared Fureman
*Assistant Examiner* — Joel Barnett

(57) ABSTRACT

A power adapter, a cable, and an electronic device capable of delivering data or electric current to another electronic device via at least two different types of cables include: an internal power source and a first resistor, and the internal power source is electrically connected to an electronic interface of the electronic device via the first resistor. A method for identifying a type of a cable and is executable by the electronic device includes: determining a measured voltage when the electronic interface of the electronic device is connected to an electronic interface of a target cable; and identifying the type of the target cable based on the measured voltage.

16 Claims, 6 Drawing Sheets

(56) References Cited

U.S. PATENT DOCUMENTS

| | | | |
|---|---|---|---|
| 2012/0003863 A1* | 1/2012 | Sung | H04Q 1/136 439/489 |
| 2013/0154547 A1 | 6/2013 | Wada | |
| 2015/0002077 A1 | 1/2015 | Wang | |
| 2015/0008749 A1* | 1/2015 | Rhee | G06F 1/266 307/80 |
| 2015/0171647 A1* | 6/2015 | Zhao | H02J 7/0029 320/107 |
| 2016/0043586 A1* | 2/2016 | Wang | H02J 7/0052 320/107 |

FOREIGN PATENT DOCUMENTS

| | | |
|---|---|---|
| CN | 101355259 A | 1/2009 |
| CN | 102959927 A | 3/2013 |
| CN | 104253458 A | 12/2014 |
| CN | 104377781 A | 2/2015 |
| CN | 104469347 A | 3/2015 |
| EP | 3131170 A1 | 2/2017 |
| WO | 2009074074 A1 | 6/2009 |
| WO | 2015048105 A1 | 4/2015 |
| WO | 2015191287 A1 | 12/2015 |

OTHER PUBLICATIONS

European Examination Report issued in corresponding European Application No. 158902593 dated Jul. 4, 2019.
Indian Examination Report issued in corresponding in application No. 201737007414 dated May 31, 2019.

* cited by examiner

400

DETERMINING A MEASURED VOLTAGE WHEN THE ELECTRONIC INTERFACE OF THE ELECTRONIC DEVICE IS CONNECTED TO AN ELECTRONIC INTERFACE OF A TARGET CABLE, WHEREIN THE MEASURED VOLTAGE IS MEASURED BETWEEN THE GROUND AND A MEASURING POSITION, AND THE MEASURING POSITION IS LOCATED BETWEEN THE FIRST RESISTOR AND THE ELECTRONIC INTERFACE OF THE ELECTRONIC DEVICE  S410

IDENTIFYING THE TYPE OF THE TARGET CABLE BASED ON THE MEASURED VOLTAGE, WHEREIN THE TYPE OF THE TARGET CABLE CORRESPONDS TO A VOLTAGE RANGE WITHIN WHICH THE MEASURED VOLTAGE FALLS, DIFFERENT TYPES OF CABLES CORRESPOND TO DIFFERENT VOLTAGE RANGES, AND THE VOLTAGE RANGE IS AT LEAST PARTIALLY DETERMINED BY OUTPUT VOLTAGE OF THE INTERNAL POWER SOURCE AND RESISTANCE VALUE OF THE FIRST RESISTOR  S420

FIG. 3

METHOD FOR IDENTIFYING TYPE OF CABLE, POWER ADAPTER AND CABLE

CROSS-REFERENCE TO RELATED APPLICATION(S)

This application is a continuation of international Patent Application PCT No. PCT/CN2015/077804, filed on Apr. 29, 2015, the content of which is hereby incorporated by reference in its entirety.

TECHNICAL FIELD

The present disclosure relates to a technical field of electronic devices, and more particularly, to a method for identifying a type of a cable, a power adapter, and a cable.

BACKGROUND

Currently, an electronic device, such as a mobile phone is usually provided with a rechargeable battery which can be charged by a power adapter.

During the charging period, for example, the power adapter can convert AC (Alternating Current) power into DC (Direct Current) power of a specified voltage to charge the electronic device.

With development of the battery charging technology, quick charging solution is introduced by applying a large electric current to charge the battery. In order to prevent heat accumulation during the charging period when the large electric current flows through a cable for power transmission, the cable with a low resistance can be used. If a cable with a high resistance is used, a large amount of heat may be accumulated during the charging period, which may cause burning of the cable.

Accordingly, in order to properly charge the battery by the quick charging solution, there is a need to identify the type of the cable (for example, an indicator indicated by the resistance of the cable or the current carrying capacity of the cable).

Currently, a method for identifying a type of a cable is already known. According to the method, an electronic chip and an information transmitter are built in the cable. When the cable has been connected to the electronic device, the electronic chip can control the information transmitter to send identification information indicative of the type of the cable to the electronic device, such that the electronic device can identify the type of the cable based on the received identification information.

However, the current method may increase the cost and complexity of the cable identification, due to the introduction of the electronic chip and the information transmitter.

BRIEF DESCRIPTION OF THE DRAWINGS

In order to more clearly illustrate technical solutions according to implementations of the present disclosure, accompanying drawings used for the implementations or related art will be briefly introduced hereinafter. Apparently, the accompanying drawings described below merely show some implementations of the present disclosure, and persons skilled in the art may derive other drawings from these accompanying drawings without creative efforts.

FIG. 3 is a schematic flowchart of a method for identifying a type of a cable according to an implementation of the present disclosure.

DETAILED DESCRIPTION

In conjunction with the drawings in the implementations of the present disclosure, a clear, complete description for the technical solutions in the implementations of the present disclosure is provided below. Apparently, the described implementations are a part rather than all of the implementations of the present disclosure. All other implementations derived by persons skilled in the art from the implementations of the present disclosure without creative efforts should fall within the protection scope of the present disclosure.

Firstly, the hardware structure of an electronic device by which a method for identifying a type of a cable according to an implementation of the present disclosure is executed is described in detail hereinafter.

Figure 1:
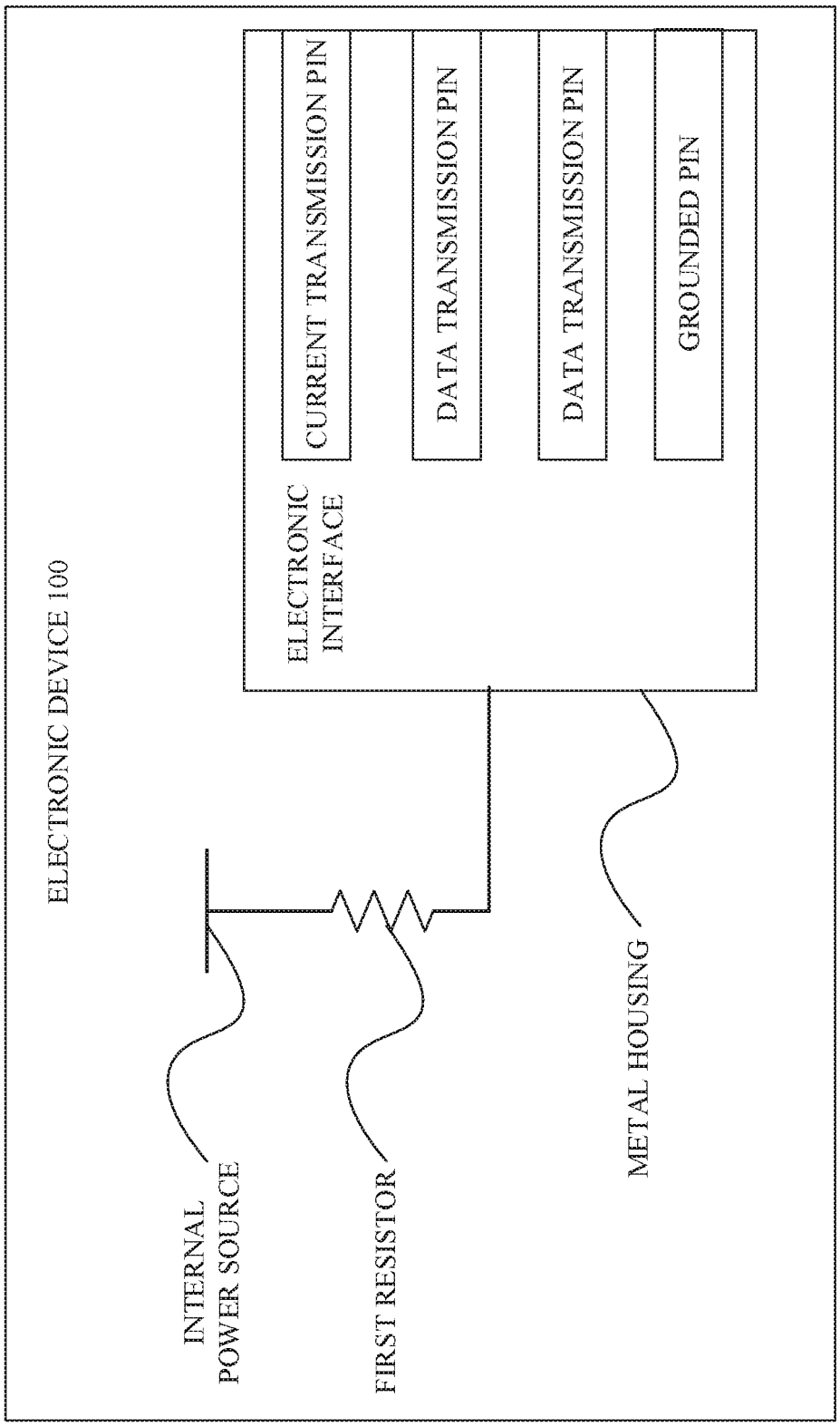
FIG. 1 is a schematic structural diagram of an example of an electronic device by which a method for identifying a type of a cable according to an implementation of the present disclosure is executed.

FIG. 1 is a schematic structural diagram of an example of an electronic device 100 by which a method for identifying a type of a cable according to an implementation of the present disclosure is executed. The electronic device 100 may be connected to at least two different types of cables via an electronic interface, and thus, may deliver data or electric current to a matching device via the cable.

In at least one implementation, the electronic device is a power adapter.

In at least one implementation, in a charging system, the power adapter may deliver data or electric current to a terminal device (i.e., an example of "the matching device", for example, an electronic product, such as a mobile phone, a tablet computer) via the cable. The power adapter may output various currents having different values, such that a corresponding current, for example, a common charging current or a quick charging current, may be output based on the type of the electronic device (for example, the allowable maximum value of the charging current).

Moreover, for example, cables may be classified into different types based on the different resistance of the cables.

For example, if the cable has a sufficiently low resistance, it is improbable to produce much heat when delivering large electric current, and thus quick charging based on the large current is allowable.

For another example, if the cable has a high resistance, heat may be produced when delivering large current, and thus, if the cable having the high resistance is connected between the power adapter and the terminal device and the quick charging based on the large current is performed, the cable may be overheated, or even a fire hazard may be caused.

Therefore, in the above-mentioned charging system, the power adapter, after being connected to the cable, should identify the type of the connected cable (for example, whether large current can be delivered, or the resistance is sufficiently low), so as to determine whether to perform the quick charging based on the large current.

It should be understood that, the types of the above-mentioned cables as well as the parameters for identifying the various types are merely exemplary, and the present disclosure is not limited to them. Other classification parameters for identifying the cables and types all fall within the protection scope of the present disclosure, for example, a cable configured for delivering data, a cable configured for delivering electric current and so on may be exemplified as the type of the cable.

Moreover, the above-mentioned power adapter is merely an example of the electronic device according to the implementation of the present disclosure, and the present disclosure is not limited to it. Other electronic devices which may be connected to various types of cables and should identify the types of the cables, all fall into the protection scope of the present disclosure, for example, the electronic device may also be a personal computer, a portable charging device or the like which can output electric current and quickly charge the terminal device.

In order to facilitate understanding and describing, the power adapter is considered as the electronic device, the structure of the electronic device and the method for identifying the type of the cable according to the implementation of the present disclosure is described in detail hereinafter.

As illustrated in FIG. 1, the power adapter (i.e., an example of the electronic device) may comprise the following components:

A. Electronic Interface (Hereinafter, in Order to Facilitate Understanding and Identifying, Referred as Electronic Interface 1).

In at least one implementation, the electronic interface 1 is configured for being connected to the electronic interface (hereinafter, in order to facilitate understanding and identifying, referred as electronic interface 2) of a cable. Moreover, the structures of the above-mentioned electronic interfaces (comprising the electronic interface 1 and the electronic interface 2) may be similar to those in related art, for example, the electronic interfaces may be prior Universal Serial Bus (USB) interfaces. In order to avoid repetition, detailed description is not provided herein.

B. Internal Power Source

In at least one implementation, the internal power source may output a voltage. The output voltage may be optional, and is for identifying a type of a cable (specific principle and process will be described in detail hereinafter). In at least one implementation, in order to improve the security of the power adapter, the internal power source outputs a safe low DC voltage. As an example rather than a limitation, the output voltage may be 3.3V.

It should be known that, in the implementation of the present disclosure, the power adapter has an adapting body which is for obtaining AC power from an external power source and converting AC power into DC power. In the implementations of the present disclosure, the adapting body may function as the internal power source, or a voltage outputting device such as a battery or the like may be arranged to function as the internal power source, which is not limited by the present disclosure.

C. First Resistor

In at least one implementation, the internal power source and the electronic interface 1 are electrically connected to each other, and the first resistor is provided in a circuit for connecting the internal power source and the electronic interface 1. The resistance value of the first resistor may be optional, and is configured for identifying the type of the cable (specific principle and process will be described in detail hereinafter). Alternatively, in at least one implementation, in order to facilitate identifying the cable, the ratio K of the resistance value of the first resistor to the resistance value of the second resistor mentioned below is within a preset range (for example, the ratio K is greater than or equal to 1:5). As an example rather than a limitation, the resistance value of the first resistor may be 10 k$\Omega$.

Therefore, the internal power source may be electrically connected to the electronic interface 1 via the first resistor, that is to say, the electric current due to the output voltage may be delivered to the electronic interface 1 via the first resistor mentioned below.

It should be understood that the structure of the above-mentioned power adapter is merely exemplary. Other functional modules and structural devices in related art which are applicable in the power adapter all fall within the protection scope of the present disclosure.

Hereinafter, in conjunction with FIG. 2, the structure of a system 200 by which a method for identifying a type of a cable according to an implementation of the present disclosure is executed is described in detail.

Figure 2:
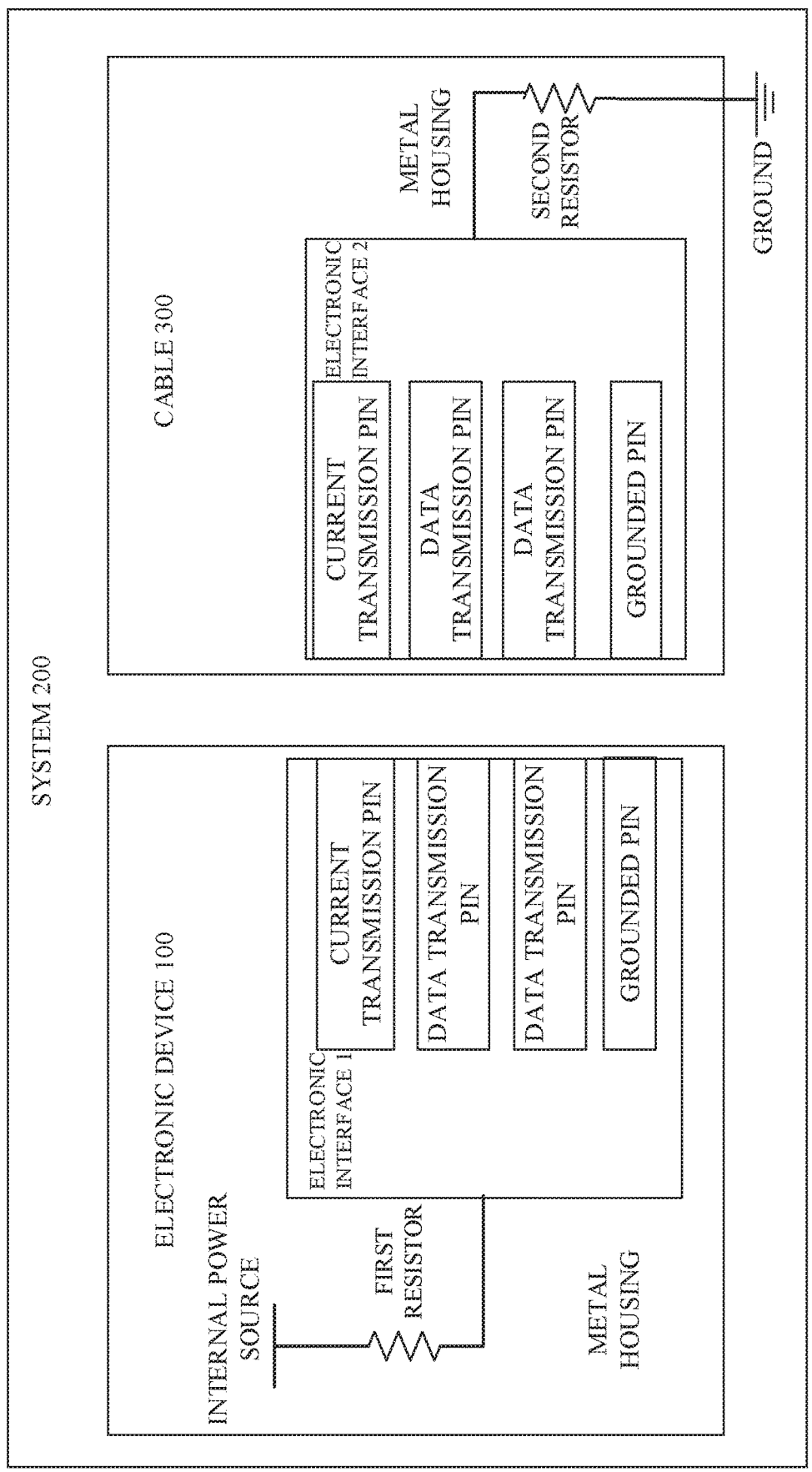
FIG. 2 is a schematic structural diagram of an example of a system by which a method for identifying a type of a cable according to an implementation of the present disclosure is executed.

FIG. 2 is a schematic diagram of an example of a system by which a method for identifying a type of a cable according to an implementation of the present disclosure is executed. As illustrated in FIG. 2, the system 200 comprises the above-mentioned electronic device 100 and a cable 300. The process of identifying the cable 300 by the electronic device 100 is taken for an example and described, hereinafter.

In at least one implementation, the target cable comprises a second resistor which is electrically connected to the electronic interface of the target cable and configured to be grounded; the voltage range may be cooperatively determined by the output voltage value of the internal power source, the resistance value of the first resistor and the resistance value of the second resistor.

As illustrated in FIG. 2, the cable 300 (i.e., an example of the target cable) may comprise the following components:

D. Electronic Interface (i.e., the Above-Mentioned Electronic Interface 2).

In at least one implementation, the electronic interface 2 is configured for being connected to the electronic interface 1 of the power adapter. Moreover, the structures of these electronic interfaces (comprising the electronic interface 1 and the electronic interface 2) may be similar to those in related art, for example, the electronic interfaces may be prior Universal Serial Bus (USB) interfaces. In order to avoid repetition, detailed description is not provided herein.

E. Second Resistor

In at least one implementation, the second resistor is electrically connected to the electronic interface 2.

In at least one implementation, the internal power source is electrically connected to a metal housing of the electronic interface of the electronic device via the first resistor, the second resistor is electrically connected to a metal housing of the electronic interface of the target cable, and the measuring position for measuring the measured voltage is located on the metal housing of the electronic interface of the electronic device.

In at least one implementation, in general, the electronic interface (for example, USB interface) is provided with a metal housing, and thus, in the implementations of the present disclosure, the metal housing may be used as electrical connection media between the first resistor and the second resistor, that is to say, the first resistor may be connected to the metal housing of the electronic interface 1 via a wire, and the second resistor may also be connected to the metal housing of the electronic interface 2 via a wire, such that when the electronic interface 1 is connected to the electronic interface 2, the metal housing of the electronic interface 1 contacts the metal housing of the electronic interface 2, and the current may be delivered from the first resistor to the second resistor by electrical conduction between the metal housings.

In addition, in order to improve the effect of the present disclosure of identifying the cable, loss of the current on the metal housing should be reduced, and in at least one implementation, the metal housing has a low resistance, for example, in at least one implementation, the metal housing has a resistance less than or equal to 100Ω.

It should be understood that, the above-mentioned electrical connection of the first resistor and the electronic interface 1, and the electrical connection of the second resistor and the electronic interface 2 are merely exemplary, and the present disclosure is not limited to them. For example, the first resistor may be electrically connected to any pin in the electronic interface 1 capable of delivering electric current (in order to facilitate understanding, referred as the first pin), the second resistor may be electrically connected to a second pin in the electronic interface 2 capable of delivering electric current, and the first pin may be electrically connected to the second pin when the electronic interface 1 is electrically connected to the electronic interface 2.

Moreover, the first pin and the second pin may be those specified in the prior USB interface agreement, or may be newly added pins in addition to those specified in the prior USB interface agreement, which is not limited by the present disclosure.

In addition, in the implementation of the present disclosure, the second resistor is configured to be grounded, that is to say, the electric current delivered to the second resistor may flow into the ground. The grounded configuration of the second resistor is described in detail hereinafter.

Moreover, the resistance value of the second resistor may be optional, and is for identifying the type of the cable (specific principle and process will be described in detail hereinafter). Alternatively, in at least one implementation, in order to facilitate identifying the cable, the ratio K of the resistance value of the first resistor to the resistance value of the second resistor is within the preset range (for example, the ratio K is greater than or equal to 1:5). As an example rather than a limitation, the resistance value of the second resistor may be 10 kΩ, 5 kΩ or 2.6 kΩ.

Hence, in the implementation of the present disclosure, when the electronic interface 1 is connected to the electronic interface 2, the electric current due to the voltage output by the internal power source is delivered to the electronic interface 1 via the first resistor, then delivered from the electronic interface 1 to the electronic interface 2, and in turn delivered from the electronic interface 2 to the second resistor. Moreover, since the second resistor is configured to be grounded, a circuit from the internal power source via the first resistor, the electronic interface 1, the electronic interface 2 and the second resistor to the ground may be formed.

As described above, in the circuit, the first resistor and the second resistor are connected in series, and thus, the output voltage from the internal power source may be divided.

Therefore, when the different types of cables are provided with second resistors having different resistance values, respectively, voltage drops across the different cables are also different, and thus it is feasible to identify the type of the connected cable based on the voltage drop across the first resistor (i.e., one example of the measured voltage), or, the voltage drop across the cable.

It should be understood that, the structure of the above-mentioned cable 300 is merely exemplary, and the present disclosure is not limited to it. For example, a common cable not provided with the second resistor in related art may be adopted as the cable 300, and in this case, since the electronic interface of the common cable cannot be configured to be grounded via the second resistor, the common cable cannot be involved in dividing the output voltage from the internal power source, that is to say, the output voltage is completely or almost applied onto the first resistor. Thus, it is feasible to identify the connected cable as a common cable, when detecting that the voltage drop across the first resistor is the output voltage from the internal power source or is almost the output voltage from the internal power source (i.e., another example of the measured voltage), or detecting that the voltage drop across the cable is zero or nearly zero.

In the implementation of the present disclosure, the voltage between the ground and a certain location in the circuit between the first resistor and the electronic interface 1 (i.e., the one example of the measured voltage) may be measured. Thus, the measured voltage is equivalent to the voltage drop across the first resistor.

As mentioned above, in order to enable the second resistor to be involved in dividing the output voltage from the internal power source, the second resistor should be configured to be grounded, and the grounded configuration of the second resistor is described in detail hereinafter.

In at least one implementation, the electronic device may further comprise a first grounded terminal configured to be grounded, and the target cable may further comprise a second grounded terminal initially suspended in the air and electrically connected to the second resistor. When the electronic interface of the target cable is connected to the electronic interface of the electronic device, the first grounded terminal is electrically connected to the second grounded terminal to enable the second grounded terminal to be grounded, and the measured voltage is measured between the measuring position and the first grounded terminal.

In at least one implementation, a grounded terminal (in order to facilitate understanding, referred as the first grounded terminal hereinafter) may further be provided in the power adapter according to the implementation of the present disclosure. The first grounded terminal may be electrically connected to the ground.

Moreover, a grounded terminal (in order to facilitate understanding, referred as the second grounded terminal hereinafter) may be provided in the cable 300. The second grounded terminal may not be directly electrically connected to the ground (i.e., being suspended in the air), since generally the cable may not be directly grounded.

In the implementation of the present disclosure, the first grounded terminal and the second grounded terminal can be electrically connected to each other via the electronic interface 1 and the electronic interface 2, and thus when the electronic interface 1 is connected to the electronic interface 2, the second grounded terminal may be connected to the ground via the first grounded terminal.

Thus, the grounded configuration of the second resistor is realized.

Moreover, in this case, since the first grounded terminal is configured to be grounded, in the implementation of the present disclosure, it is feasible to measure the voltage between the first grounded terminal and a certain location in the circuit between the first resistor and the electronic interface 1 (i.e., the another example of the measured voltage). Thus, the measured voltage is equivalent to the voltage drop across the first resistor.

In at least one implementation, the first grounded terminal comprises a grounded pin in the USB interface of the electronic device, and the second grounded terminal comprises a grounded pin in the USB interface of the target cable.

In at least one implementation, in related art, the grounded pin in the USB interface may be configured to be grounded, and thus, when the USB interface is used as the electronic interface 1, the grounded pin in the USB interface may be used as the first grounded terminal. Similarly, when the USB interface is used as the electronic interface 2, the grounded pin in the USB interface may be used as the second grounded terminal.

It is should be understood that, the above-mentioned grounded configuration of the second resistor is merely exemplary, and the present disclosure is not limited to it. For example, when the terminal device (for example, an electronic device to be charged, such as a mobile phone or a tablet computer) to which the cable is connected may be connected to the ground, the second resistor may also be connected to the ground via the grounded terminal in the terminal device.

In addition, the structure of the above-mentioned cable 300 is merely exemplary, and the present disclosure is not limited to it. Various functional modules and structural devices in related art which are applicable in a cable are all applicable in the cable 300 according to the implementation of the present disclosure.

In the above, the hardware structure of the electronic device and the system by which the method for identifying a type of a cable according to the implementation of the present disclosure is executed is described. Hereinafter, in conjunction with FIG. 3, the method for identifying a type of a cable according to an implementation of the present disclosure is described in detail.

FIG. 3 is a schematic flowchart of a method 400 for identifying a type of a cable according to an implementation of the present disclosure. The method 400 is executed by an electronic device capable of delivering data or electric current to another electronic device via at least two different types of cables, the electronic device comprising an internal power source and a first resistor, and the internal power source being electrically connected to an electronic interface of the electronic device via the first resistor. As illustrated in FIG. 3, the method 400 comprises the following steps.

Step S410: a measured voltage is determined when the electronic interface of the electronic device is connected to an electronic interface of a target cable, wherein the measured voltage is measured between the ground and a measuring position, and the measuring position is located between the first resistor and the electronic interface of the electronic device.

Step S420: the type of the target cable is identified based on the measured voltage, wherein the type of the target cable corresponds to a voltage range within which the measured voltage falls, different types of cables correspond to different voltage ranges, and the voltage range is at least partially determined by output voltage of the internal power source and resistance value of the first resistor.

In at least one implementation, when the electronic interface 1 is connected to the electronic interface 2, a circuit from the internal power source via the first resistor, the electronic interface 1, the electronic interface 2 and the second resistor to the ground may be formed (when the cable does not comprise the second resistor, a circuit from the internal power source via the first resistor and the electronic interface 1 to the ground may be formed). In this case, by measuring a voltage (i.e., measured voltage) between the ground and the measuring position between the first resistor and the electronic interface 1, the voltage drop across the second resistor (or, the voltage drop across the first resistor) may be determined. Moreover, due to the different resistance values of the second resistors provided in the different types of cables, the voltage drops across the different cables are also different, and thus, the connected cable may be identified based on the measured voltage.

Moreover, in the implementation of the present disclosure, a voltage sensor (for example, a voltmeter and etc.) may be provided in the power adapter, and the measured voltage may be obtained by the voltage sensor.

Additionally, in the implementation of the present disclosure, if cables are classified into cables supporting quick charging based on the large current (i.e., cables having low resistances, referred as quick charging cables, hereinafter) and cables not supporting quick charging based on the large current (i.e., cables having high resistances, referred as common cables, hereinafter), a voltage range may be preset in the power adapter. For example, the voltage range may be determined by the output voltage value of the internal power source and resistance value of the first resistor, that is to say, if the connected cable is a prior common cable, the cable is not involved in dividing the output voltage from the internal power source due to the absence of the second resistor in the common cable, and thus, the obtained measured voltage is the output voltage of the internal power source or is almost the output voltage of the internal power source.

Therefore, if the measured voltage is almost the output voltage of the internal power source, the adapter may determine the connected cable is a prior common cable.

In at least one implementation, identifying the type of the target cable based on the measured voltage, comprises:

Establishing a mapping relationship between at least two voltage ranges and the at least two correspondent types of cables, wherein the second resistors of different types of cables have different resistance values;

Determining the voltage range within which the measured voltage falls, from the at least two voltage ranges; and Identifying the type of the cable corresponding to the voltage range based on the mapping relationship.

In at least one implementation, the second resistors having different resistance values may be provided for different types of cables respectively, and the voltage range corresponding to each type of cable may be cooperatively determined by the output voltage of the internal power source, the resistance value of the first resistor and the resistance value of the second resistor.

In at least one implementation, the output voltage of the internal power source is set as 3.3V, the resistance value of the first resistor is set as 10 kΩ. And if the resistance value of the second resistor of a first type of the cable is set as 10 kΩ, the correspondent voltage range is ranged from 1.6V to 1.8V; if the resistance value of the second resistor of a first type of the cable is set as 5 kΩ, the correspondent voltage range is ranged from 1.0V to 1.2V; and if the resistance value of the second resistor of a first type of the cable is set as 2.6 kΩ, the correspondent voltage range is ranged from 0.6V to 0.8V.

In at least one implementation, for example, when the output voltage is 3.3V, and the resistance value of the first resistor is 10 kΩ, the voltage range corresponding to the type of the cable provided with the second resistor having a resistance value of 10 kΩ (for example, a cable capable of delivering a maximum current of 7 A on the premise that the security is ensured when using) may be 1.6~1.8V, or the voltage range corresponding to the type of the cable provided with the second resistor having a resistance value of 5 kΩ (for example, a cable capable of delivering a maximum current of 5 A on the premise that the security is ensured when using) may be 1.0~1.2V, or the voltage range corresponding to the type of the cable provided with the second resistor having a resistance value of 1.2 kΩ (for example, a cable capable of delivering a maximum current of 4 A on the premise that the security is ensured when using) may be 0.6~0.8V.

It should be understood that, the voltage range corresponding to the type of the above-mentioned each cable is merely exemplary, and the present disclosure is not limited to it. For example, when the output voltage and the resistance value of the first resistor are constant, the voltage range corresponding to the type of the cable may be changed by adjusting the resistance value of the second resistor provided in the cable.

Therefore, for example, if the measured voltage is 1.7V, the adapter may determine that the measured voltage within a voltage range of 1.6~1.8V, and in turn, may determine that the type of connected cable is the type corresponding to the voltage range (i.e., a cable capable of delivering a maximum current of 7 A).

In at least one implementation, the different types of cables have current carrying capacities thereof different from each other, and the method further comprises: determining a current range of the target cable, the current range being less than or equal to the current carrying capacity of the target cable.

In at least one implementation, after the adapter identifies the type of the cable, for example, determines as described above that the connected cable is a cable capable of delivering a maximum current of 7 A, the adapter may quickly charge the terminal device with the large current (less than 7 A) when the terminal device may be quickly charged by the large current.

In accordance with the method for identifying a type of a cable according to the implementation of the present disclosure, the internal power source and the first resistor is provided in the electronic device outputting current, and the voltage output by the internal power source may be applied to the first resistor and the target cable when the electronic device is connected to the cable; thus, by measuring the measured voltage between the ground and the measuring position located between the first resistor and the electronic interface of the power adapter, the type of the cable may be identified, and the cost of identifying the type of the cable is low.

Figure 4:
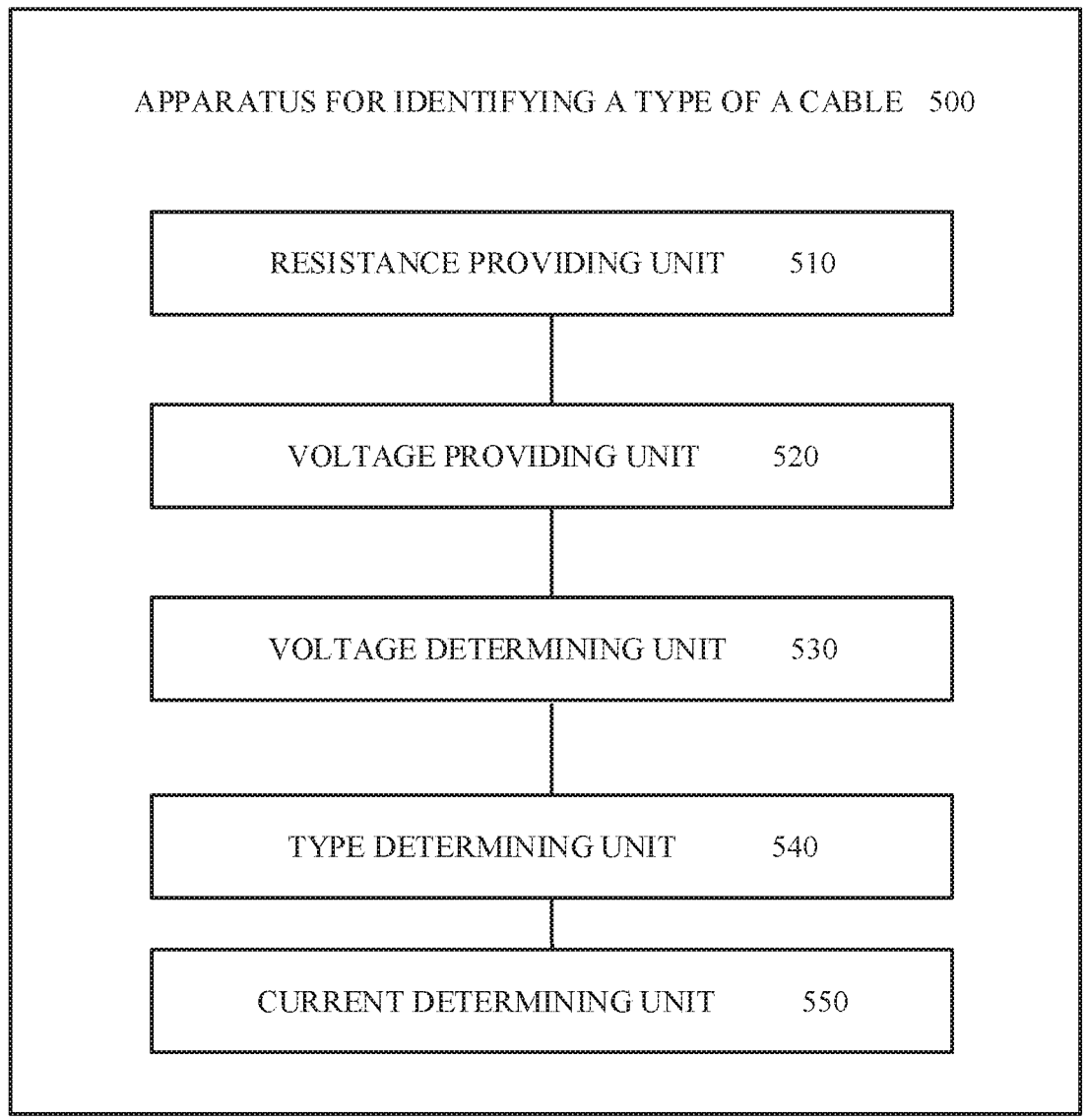
FIG. 4 is a schematic block diagram of an apparatus for identifying a type of a cable according to an implementation of the present disclosure.

FIG. 4 is a schematic block diagram of an apparatus 500 for identifying a type of a cable according to an implementation of the present disclosure. The apparatus 500 is provided in an electronic device capable of delivering data or electric current to another electronic device via at least two different types of cables. As illustrated in FIG. 4, the apparatus 500 comprises:

A resistance providing unit 510 for providing a first resistor;

A voltage providing unit 520 configured for outputting an output voltage, being electrically connected to an electronic interface of the electronic device via the first resistor; and A voltage determining unit 530 for determining a measured voltage when the electronic interface of the electronic device is connected to an electronic interface of the target cable, wherein the measured voltage is measured between the ground and a measuring position, and the measuring position is located between the first resistor and the electronic interface of the electronic device.

A type determining unit 540 for identifying the type of the target cable based on the measured voltage, wherein the type of the target cable corresponds to a voltage range within which the measured voltage falls, and the voltage range is at least partially determined by output voltage of the internal power source and resistance value of the first resistor.

In at least one implementation, the target cable comprises a second resistor which is electrically connected to the electronic interface of the target cable and configured to be grounded; and the voltage range is cooperatively determined by the output voltage value of the internal power source, the resistance value of the first resistor and the resistance value of the second resistor.

In at least one implementation, the electronic device further comprises a first grounded terminal configured to be grounded, and the target cable further comprises a second grounded terminal initially suspended in the air and electrically connected to the second resistor. When the electronic interface of the target cable is connected to the electronic interface of the electronic device, the first grounded terminal is electrically connected to the second grounded terminal to enable the second grounded terminal to be grounded, and the voltage determining unit is for measuring a voltage as the measured voltage between the measuring position and the first grounded terminal.

In at least one implementation, the voltage providing unit is electrically connected to a metal housing of the electronic interface of the electronic device via the first resistor, the second resistor is electrically connected to a metal housing of the electronic interface of the target cable, and the measuring position is located on the metal housing of the electronic interface of the electronic device.

In at least one implementation, the type determining unit is for establishing a mapping relationship between at least two voltage ranges and the at least two types of cables, wherein the second resistors of different types of cables have different resistance values; determining the voltage range within which the measured voltage falls, from the at least two voltage ranges; and identifying the type of the cable corresponding to the voltage range based on the mapping relationship.

In at least one implementation, the output voltage of the voltage providing unit is set as 3.3V, and the resistance value of the first resistor is set as 10 k 6. And if the resistance value of the second resistor of a first type of the cable is set as 10 kΩ, the correspondent voltage range is ranged from 1.6V to 1.8V; if the resistance value of the second resistor of a first type of the cable is set as 5 kΩ, the correspondent voltage range is ranged from 1.0V to 1.2V; and if the resistance value of the second resistor of a first type of the cable is set as 2.6 kΩ, the correspondent voltage range is ranged from 0.6V to 0.8V.

In at least one implementation, the different types of cables have current carrying capacities thereof different from each other, and the apparatus further comprises a current determining unit 550 for determining a current range of the target cable, the current range being less than or equal to the current carrying capacity of the target cable.

In at least one implementation, the electronic device is a power adapter.

In at least one implementation, the electronic interfaces of the electronic device and the target cable are USB interfaces.

In at least one implementation, the first grounded terminal is a grounded pin in the USB interface of the electronic device, and the second grounded terminal is a grounded pin in the USB interface of the target cable.

The apparatus 500 for identifying a type of a cable according to the implementation of the present disclosure may correspond to an execution entity of the method 400 for identifying a type of a cable according to the implementation of the present disclosure, and function of each unit or module in the apparatus 500 is for implementing each step or process in the method 400 as illustrated in FIG. 3, respectively. In order to avoid repetition, detailed description is not provided herein.

In accordance with the apparatus for identifying a type of a cable according to the implementation of the present disclosure, the voltage providing unit and the resistance providing unit is provided in the electronic device outputting electric current, and the voltage output by the internal power source may be applied to the the resistance providing unit and the target cable when the electronic device is connected to the cable; thus, by measuring the measured voltage between the ground and the measuring position located between the first resistor and the electronic interface of the electronic device, the type of the cable may be identified, and the cost of identifying the type of the cable is low.

Figure 5:
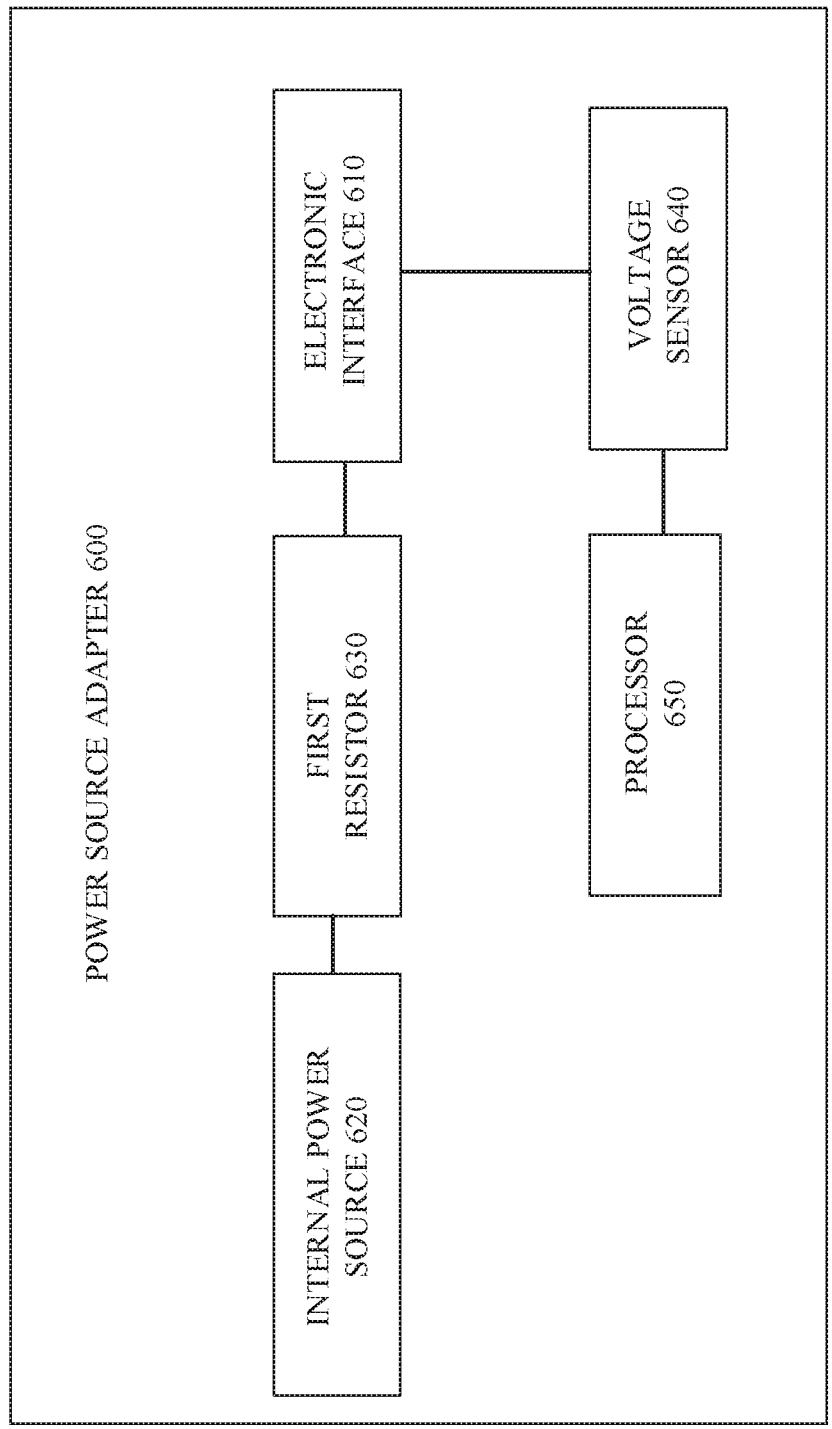
FIG. 5 is a schematic structural diagram of a power adapter according to an implementation of the present disclosure.

FIG. 5 is a schematic structural diagram of a power adapter 600 according to an implementation of the present disclosure. The power adapter 600 is capable of delivering data or electric current to an electronic device via at least two different types of cables. As illustrated in FIG. 5, the power adapter 600 comprises:

An electronic interface 610 configured for being connected to an electronic interface of a cable;

An internal power source 620 electrically connected to the electronic interface and configured for outputting an output voltage;

A first resistor 630 provided between the electronic interface of the power adapter and the internal power source;

A voltage sensor 640 configured for determining a measured voltage when the electronic interface of the power adapter is connected to the electronic interface of the target cable, wherein the measured voltage is measured between the ground and a measuring position, and the measuring position is located between the first resistor and the electronic interface of the power adapter; and A processor 650 communicatively connected to the voltage sensor and configured for identifying the type of the target cable based on the measured voltage, wherein the type of the target cable corresponds to a voltage range within which the measured voltage falls, different types of cables correspond to different voltage ranges, and the voltage range is at least partially determined by output voltage of the internal power source and resistance value of the first resistor.

In at least one implementation, the target cable comprises a second resistor which is electrically connected to the electronic interface of the target cable and configured to be grounded; and the voltage range is cooperatively determined by the output voltage value of the internal power source, the resistance value of the first resistor and the resistance value of the second resistor.

In at least one implementation, the target cable may further comprise a second grounded terminal initially suspended in the air and electrically connected to the second resistor. The power adapter further comprises a first grounded terminal configured to be grounded, and when the electronic interface of the target cable is connected to the electronic interface of the power adapter, the first grounded terminal is electrically connected to the second grounded terminal to enable the second grounded terminal to be grounded. The voltage sensor is configured for measuring a voltage as the measured voltage between the measuring position and the first grounded terminal.

In at least one implementation, the internal power source is electrically connected to a metal housing of the electronic interface of the power adapter via the first resistor, the second resistor is electrically connected to a metal housing of the electronic interface of the target cable, and the measuring position is located on the metal housing of the electronic interface of the power adapter.

In at least one implementation, the processor is configured for establishing a mapping relationship between at least two voltage ranges and the at least two correspondent types of cables, wherein the second resistors of different types of cables have different resistance values; determining the voltage range within which the measured voltage falls, from the at least two voltage ranges; and identifying the type of the cable corresponding to the voltage range based on the mapping relationship.

In at least one implementation, the output voltage of the internal power source is set as 3.3V, and the resistance value of the first resistor is set as 10 k$\Omega$. And if the resistance value of the second resistor of a first type of the cable is set as 10 k$\Omega$, the correspondent voltage range is ranged from 1.6V to 1.8V; if the resistance value of the second resistor of a first type of the cable is set as 5 k$\Omega$, the correspondent voltage range is ranged from 1.0V to 1.2V; and if the resistance value of the second resistor of a first type of the cable is set as 2.6 k$\Omega$, the correspondent voltage range is ranged from 0.6V to 0.8V.

In at least one implementation, the different types of cables have current carrying capacities thereof different from each other, and the processor is further configured for determining a current range of the target cable, the current range being less than or equal to the current carrying capacity of the target cable.

In at least one implementation, the electronic interfaces of the power adapter and the target cable are USB interfaces.

In at least one implementation, the first grounded terminal is a grounded pin in the USB interface of the power adapter, and the second grounded terminal is a grounded pin in the USB interface of the target cable.

It should be understood that, in the implementations of the present disclosure, the processor may be a central processing unit (CPU), and the processor may also be another general processor, a digital signal processor (DSP), an application-specific integrated circuit (ASIC), a field-programmable gate array (FPGA), or another programmable logic device, independent gate or transistor logic device, independent hardware component and so on. The general processor may be a microprocessor, or the processor may also be any conventional processor and so on.

During the implementation, all steps of the foregoing method may be completed by an integrated logic circuit of hardware or instructions in software forms in the processor. The steps of the processing method disclosed in the implementations of the present disclosure may be directly executed by a hardware processor, or by a combination of hardware and software modules in the processor. The software modules may be located in a random access memory, a flash memory, a read-only memory, a programmable read-only memory, an electrically erasable programmable memory, a register, or any other storage medium that is mature in the art. The storage medium is located in the memory. The processor reads information from the memory, and executes the steps of the foregoing processing method in combination with hardware of the processor. In order to avoid repetition, detailed description is not provided herein again.

Structure and function of the power adapter 600 according to the implementation of the present disclosure may be identical with the execution entity (i.e., the electronic device 100) of the method 400 for identifying a type of a cable according to the implementation of the present disclosure, and function of each unit or module in the power adapter 600 is for implementing each step or process in the method 400 as illustrated in FIG. 3, respectively. In order to avoid repetition, detailed description is not provided herein.

In accordance with the power adapter according to the implementation of the present disclosure, the internal power source and the first resistor is provided in the electronic device outputting electric current, and the voltage output by the internal power source may be applied to the first resistor and the target cable when the electronic device is connected to the cable; thus, by measuring the measured voltage between the ground and the measuring position located between the first resistor and the electronic interface of the electronic device, the type of the cable may be identified, and the cost of identifying the type of the cable is low.

Figure 6:
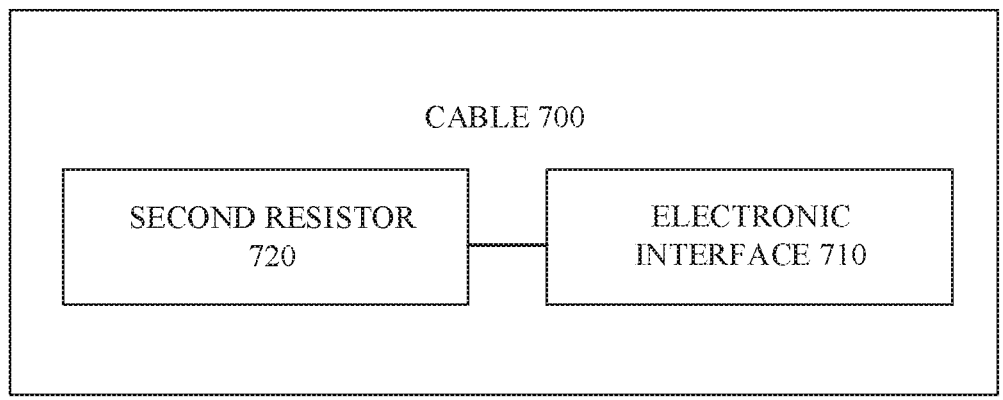
FIG. 6 is a schematic structural diagram of a cable according to an implementation of the present disclosure.

FIG. 6 is a schematic structural diagram of a cable 700 according to an implementation of the present disclosure. As illustrated in FIG. 6, the cable 700 comprises an electronic interface 710 configured for being connected to an electronic interface of a power adapter and a second resistor 720 electrically connected to the electronic interface of the cable and configured to be grounded.

In at least one implementation, the electronic interfaces of the power adapter and the target cable are USB interfaces.

In at least one implementation, the power adapter comprises a first grounded terminal configured to be grounded, and the target cable further comprises a second grounded terminal electrically connected to the second resistor and initially suspended in the air, wherein when the electronic interface of the target cable is connected to the electronic interface of the power adapter, the first grounded terminal is electrically connected to the second grounded terminal to enable the second grounded terminal to be grounded.

In at least one implementation, the first grounded terminal is a grounded pin in the USB interface of the power adapter, and the second grounded terminal is a grounded pin in the USB interface of the target cable.

In at least one implementation, the second resistor is electrically connected to a metal housing of the electronic interface of the target cable.

In at least one implementation, the cable is a charging cable for quick charging.

Structure and function of the cable 700 according to the implementation of the present disclosure may be identical with the cable 300. In order to avoid repetition, detailed description is not provided herein.

In accordance with the cable of according to the implementation of the present disclosure, the internal power source and the first resistor is provided in the power adapter outputting electric current, the second resistor is provided in the cable, and the voltage output by the internal power source may be applied to the first resistor and the second resistor when the power adapter is electrically connected to the target cable; thus, by measuring the measured voltage between the ground and the measuring position located between the first resistor and the electronic interface of the electronic device, the resistance value of the second resistor in the connected cable may be determined, and by providing different second resistors in different cables, the type of the connected cable may be identified based on the measured voltage or the second resistor, and the cost of identifying the type of the cable is low.

It should be understood that in the implementations of the present disclosure, the sequence numbers in each process do not represent an execution sequence; the execution sequence of each process should be determined by function and internal logic of the process, and should not be construed as a limitation on the implementation processes of the implementations of the present disclosure.

Persons skilled in the art may be aware that, units and algorithm steps of the examples described in combination with the implementations disclosed in this specification may be implemented by electronic hardware or a combination of computer software and electronic hardware. Whether these functions are performed by hardware or software depends on specific applications and design constraint conditions of the technical solutions. Persons skilled in the art may use different methods to implement the described functions for each specific application, but it should not be considered that the implementation goes beyond the scope of the present disclosure.

It may be clearly understood by persons skilled in the art that, for the purpose of convenient and brief description, reference may be made to a corresponding process in the foregoing method implementations for a specific operating process of the foregoing system, apparatus and unit, and details are not described herein again.

In the several implementations provided in the present application, it should be understood that, the disclosed system, apparatus and method may be implemented in other manners. For example, the described apparatus implementation is merely exemplary. For example, division for the unit is merely logical function division and may be other division in actual implementation. For example, multiple units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, i.e., may be located in one position, or may be distributed among multiple network units. A part or all of the units may be selected according to actual requirements to achieve the objectives of the solutions of the implementations.

In addition, functional units in the implementations of the present disclosure may be integrated into one processing unit, or each of the units may exist physically separately, or two or more units are integrated into one unit.

When the functions are implemented in a form of a software functional unit and sold or used as an independent product, the functions may be stored in a computer-readable storage medium. Based on such an understanding, the technical solutions of the present disclosure essentially, or the part contributing to the related art, or a part of the technical solutions may be implemented in a form of a software product. The computer software product is stored in a storage medium, and comprises several instructions for instructing a computer device (which may be a personal computer, a server, a network device, or the like) to perform all or a part of the steps of the methods described in the implementations of the present disclosure. The foregoing storage medium comprises any medium that can store program code, such as a USB flash memory, a removable hard disk, a read-only memory (ROM), a random access memory (RAM), a magnetic disk, or an optical disc.

The foregoing descriptions are merely implementations of the present disclosure, but are not intended to limit the protection scope of the present disclosure. Any variation or replacement readily figured out by persons skilled in the art within the technical scope disclosed in the present disclosure should fall within the protection scope of the present disclosure. Therefore, the protection scope of the present disclosure should be subject to the protection scope of the claims.

What is claimed is:

1. A method for identifying a type of a cable executable by an electronic device comprising a first resistor and an internal power source electrically connected to an electronic interface of the electronic device via the first resistor, comprising:
   determining a measured voltage when the electronic interface of the electronic device is connected to an electronic interface of a target cable, wherein the measured voltage is measured between a ground position and a measuring position, the internal power source is electrically connected to a metal housing of the electronic interface of the electronic device via the first resistor, the measuring position is located on the metal housing of the electronic interface of the electronic device, and the electronic device is capable of delivering data or an electric current to another electronic device via at least two different types of cables; and
   identifying a type of the target cable based on the measured voltage, wherein the type of the target cable corresponds to a voltage range within which the measured voltage falls, different types of cables correspond to different voltage ranges, and the voltage range is at least partially determined by an output voltage of the internal power source and a resistance value of the first resistor.

2. The method of claim 1, wherein the target cable comprises a second resistor electrically connected to the electronic interface of the target cable and configured to be grounded, and the voltage range is cooperatively determined by the output voltage of the internal power source, the resistance value of the first resistor, and a resistance value of the second resistor.

3. The method of claim 2, wherein the electronic device further comprises a first grounded terminal configured to be grounded, and the target cable further comprises a second grounded terminal initially suspended in air and electrically connected to the second resistor, and further wherein when the electronic interface of the target cable is connected to the electronic interface of the electronic device, the first grounded terminal is electrically connected to the second grounded terminal to enable the second grounded terminal to be grounded, and the measured voltage is measured between the measuring position and the first grounded terminal.

4. The method of claim 2, wherein the second resistor is electrically connected to a metal housing of the electronic interface of the target cable.

5. The method of claim 2, wherein identifying the type of the target cable based on the measured voltage comprises:
   establishing a mapping relationship between at least two voltage ranges and at least two correspondent types of cables, wherein second resistors of different types of cables have different resistance values;
   determining the voltage range within which the measured voltage falls, from the at least two voltage ranges; and
   identifying the type of the cable corresponding to the voltage range based on the mapping relationship.

6. The method of claim 5, wherein the output voltage of the internal power source is set as 3.3V, the resistance value of the first resistor is set as 10 kΩ, and
   when the resistance value of the second resistor of a first type of the cable is set as 10 kΩ, a correspondent voltage range is ranged from 1.6V to 1.8V;
   when the resistance value of the second resistor of the first type of the cable is set as 5 kΩ, the correspondent voltage range is ranged from 1.0V to 1.2V; and
   when the resistance value of the second resistor of the first type of the cable is set as 2.6 kΩ, the correspondent voltage range is ranged from 0.6V to 0.8V.

7. The method of claim 1, wherein the different types of cables have current carrying capacities thereof different from each other, and the method further comprises determining a current range of the target cable, the current range being less than or equal to the current carrying capacity of the target cable.

8. The method of claim 1, wherein the electronic interface of the electronic device and the electronic interface of the target cable are USB interfaces, a first grounded terminal is a grounded pin in the USB interface of the electronic device, and a second grounded terminal is a grounded pin in the USB interface of the target cable.

9. A power adapter, comprising:
   an electronic interface configured to be connected to an electronic interface of a cable;
   an internal power source electrically connected to the electronic interface and configured to output an output voltage;
   a first resistor provided between the electronic interface of the power adapter and the internal power source;
   a voltage sensor configured to determine a measured voltage when the electronic interface of the power adapter is connected to the electronic interface of a target cable, wherein the measured voltage is measured between a ground position and a measuring position, the internal power source is electrically connected to a metal housing of the electronic interface of the electronic device via the first resistor, and the measuring position is located on the metal housing of the electronic interface of the power adapter, and the power adapter is capable of delivering data or an electric current to an electronic device via at least two different types of cables; and
   a processor communicatively connected to the voltage sensor and configured to identify a type of the target cable based on the measured voltage, wherein the type of the target cable corresponds to a voltage range within which the measured voltage falls, different types of cables correspond to different voltage ranges, and the voltage range is at least partially determined by an output voltage of the internal power source and a resistance value of the first resistor.

10. The power adapter of claim 9, wherein the target cable comprises a second resistor electrically connected to the electronic interface of the target cable and configured to be grounded, and the voltage range is cooperatively determined by the output voltage of the internal power source, the resistance value of the first resistor and a resistance value of the second resistor.

11. The power adapter of claim 10, wherein the target cable further comprises a second grounded terminal initially suspended in air and electrically connected to the second resistor;

the power adapter further comprises a first grounded terminal configured to be grounded, wherein when the electronic interface of the target cable is connected to the electronic interface of the power adapter, the first grounded terminal is electrically connected to the second grounded terminal to enable the second grounded terminal to be grounded; and the voltage sensor is configured for measuring a voltage as the measured voltage between the measuring position and the first grounded terminal.

12. The power adapter of claim 10, wherein the second resistor is electrically connected to a metal housing of the electronic interface of the target cable.

13. The power adapter of claim 10, wherein the processor is further configured to:

establish a mapping relationship between at least two voltage ranges and at least two correspondent types of cables, wherein second resistors of different types of cables have different resistance values;

determine the voltage range within which the measured voltage falls, from the at least two voltage ranges; and identify the type of the cable corresponding to the voltage range based on the mapping relationship.

14. The power adapter of claim 13, wherein the output voltage of the internal power source is set as 3.3V, the resistance value of the first resistor is set as 10 kΩ, and when the resistance value of the second resistor of a first type of the cable is set as 10 kΩ, a correspondent voltage range is ranged from 1.6V to 1.8V;

when the resistance value of the second resistor of the first type of the cable is set as 5 kΩ, the correspondent voltage range is ranged from 1.0V to 1.2V; and when the resistance value of the second resistor of the first type of the cable is set as 2.6 kΩ, the correspondent voltage range is ranged from 0.6V to 0.8V.

15. The power adapter of claim 9, wherein the different types of cables have current carrying capacities thereof different from each other, and the processor is further configured to determine a current range of the target cable, the current range being less than or equal to the current carrying capacity of the target cable.

16. The power adapter of claim 9, wherein the electronic interface of the power adapter and the electronic interface of the target cable are USB interfaces, a first grounded terminal is a grounded pin in the USB interface of the power adapter, and a second grounded terminal is a grounded pin in the USB interface of the target cable.

* * * * *